US 6,630,391 B2

(12) United States Patent
Agarwal et al.

(10) Patent No.: US 6,630,391 B2
(45) Date of Patent: Oct. 7, 2003

(54) BORON INCORPORATED DIFFUSION BARRIER MATERIAL

(75) Inventors: Vishnu K. Agarwal, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 09/839,584

(22) Filed: Apr. 20, 2001

(65) Prior Publication Data
US 2002/0001908 A1 Jan. 3, 2002

Related U.S. Application Data

(62) Division of application No. 09/382,295, filed on Aug. 24, 1999.

(51) Int. Cl.[7] .............................................. H01L 21/425
(52) U.S. Cl. ....................................... 438/532; 438/685
(58) Field of Search ................... 438/300, 573, 438/685

(56) References Cited

U.S. PATENT DOCUMENTS

| | | | |
|---|---|---|---|
| 4,761,386 A | 8/1988 | Buynoski | 438/15 |
| 4,823,182 A | 4/1989 | Okumura | 438/626 |
| 4,884,123 A | 11/1989 | Dixit et al. | 257/751 |
| 4,895,770 A | 1/1990 | Schintlmeister et al. | 428/552 |
| 4,920,071 A | 4/1990 | Thomas | 438/626 |
| 5,225,771 A | 7/1993 | Leedy | 324/757 |
| 5,248,903 A | 9/1993 | Heim | 257/748 |
| 5,298,333 A | 3/1994 | Maixner et al. | 428/472 |
| 5,364,803 A | 11/1994 | Lur et al. | 438/592 |
| 5,391,516 A | 2/1995 | Wojnarowski et al. | 438/612 |
| 5,441,904 A | 8/1995 | Kim et al. | 438/592 |
| 5,486,492 A | 1/1996 | Yamamoto et al. | 438/629 |
| 5,506,499 A | 4/1996 | Puar | 324/158.1 |
| 5,541,427 A | 7/1996 | Chappell et al. | 257/374 |
| 5,593,903 A | 1/1997 | Beckenbaugh et al. | 438/18 |
| 5,668,394 A | 9/1997 | Lur et al. | 257/413 |
| 5,684,304 A | 11/1997 | Smears | 257/48 |
| 5,693,377 A | 12/1997 | Westmoreland et al. | 427/582 |
| 5,720,098 A | 2/1998 | Kister | 29/825 |
| 5,742,174 A | 4/1998 | Kister et al. | 324/754 |
| 5,837,598 A | 11/1998 | Aronowitz et al. | 438/532 |
| 5,851,680 A | 12/1998 | Heau | 438/472 |
| 5,920,081 A | 7/1999 | Chen et al. | 257/48 |
| 5,962,867 A | 10/1999 | Liu | 257/48 |
| 5,968,594 A | 10/1999 | Hu et al. | 427/248.1 |
| 5,994,716 A | 11/1999 | Ikeya et al. | 257/48 |
| 6,017,818 A | 1/2000 | Lu | 438/653 |
| 6,028,360 A | * 2/2000 | Nakamura et al. | 257/306 |
| 6,069,482 A | 5/2000 | Hilton | 324/765 |
| 6,133,582 A | 10/2000 | Osann, Jr. et al. | 257/48 |
| 6,200,649 B1 | 3/2001 | Dearnaley | 427/530 |
| 6,251,190 B1 | 6/2001 | Mak et al. | 118/715 |

FOREIGN PATENT DOCUMENTS

EP 0 854 505 A2 1/1998

OTHER PUBLICATIONS

Baker, et al. "Combined X–Ray Photoelectron/auger Electron Spectroscopy/Glaning Angle X–Ray diffraction/Extended X–Ray Absorbtion Fine Structure Investigation of TiBxNy Coatings". J. Vac. Sci. Technol., A 15(2), pp. 284–291, Mar./Apr. 1997.

Sade, et al., "Characterization of $TiB_2/TiSi_2$ Bilayer Structure Deposited By Sputtering", Mat. Res. Soc. Smp. Proc., vol. 402, pp. 131–136, 1996.

* cited by examiner

Primary Examiner—W. David Coleman
(74) Attorney, Agent, or Firm—Knobbe, Martens, Olson & Bear, LLP

(57) ABSTRACT

A diffusion barrier layer comprising $TiN_xB_y$ is disclosed for protection of gate oxide layers in integrated transistors. The diffusion barrier layer can be fabricated by first forming a TiN layer and then incorporating boron into the TiN layer. The diffusion barrier layer can also be fabricated by forming a $TiN_xB_y$ layer using a TDMAT process including boron. The diffusion barrier layer can also be fabricated by forming a $TiN_xB_y$ layer using a CVD process. The diffusion barrier layer is of particular utility in conjunction with tungsten or tungsten silicide conductive layers formed by CVD.

18 Claims, 3 Drawing Sheets

BORON INCORPORATED DIFFUSION BARRIER MATERIAL

This application is a divisional of U.S. patent application Ser. No. 09/382,295, filed on Aug. 24, 1999, which is currently pending.

BACKGROUND OF THE INVENTION

1. Field of the Invention

The present invention relates in general to materials used during integrated circuit fabrication, and more particularly to materials used as diffusion barriers.

2. Background

A gate electrode is a structure commonly found in an integrated circuit. One fabrication technique of a gate electrode begins with the formation a gate oxide film on a semiconductor substrate. Following this step, a polysilicon layer is formed on the gate oxide film. A tungsten silicide layer is then deposited over the polysilicon layer using a chemical vapor deposition (CVD) process. The CVD process may include the use of a fluorine-containing gas, such as tungsten hexafluoride ($WF_6$). Therefore, during CVD, fluorine atoms can be incorporated into the tungsten silicide layer.

Once the gate oxide film, the polysilicon layer, and the tungsten silicide layer have been formed on the substrate, the device is annealed. During this anneal, fluorine atoms undesirably diffuse from the tungsten silicide layer through the polysilicon layer to the gate oxide film.

To reduce the diffusion of fluorine atoms during the anneal, attempts have been made to incorporate a diffusion barrier layer under the tungsten silicide layer during the fabrication of gate electrodes. Conductive diffusion barrier layers comprise materials such as titanium nitride, titanium tungsten, or tantalum nitride. Although these materials inhibit fluorine diffusion to some extent, they still allow a substantial amount of fluorine to diffuse from the metal layer to the gate oxide film.

When fluorine atoms diffuse to the gate oxide film, they react with the gate oxide film in a manner that increases its electrical thickness. Furthermore, fluorine diffusion can lower breakdown voltage and increase defect density. Fluorine diffusion can also cause device degradation, such as a shift in threshold voltage or a decrease in saturation current.

SUMMARY OF THE INVENTION

A diffusion barrier layer comprising $TiN_xB_y$ is disclosed for protection of gate oxide layers in integrated transistors. The diffusion barrier layer can be fabricated by first forming a TiN layer and then incorporating boron into the TiN layer. The diffusion barrier layer can also be fabricated by forming a $TiN_xB_y$ layer using a TDMAT process including boron. The diffusion barrier layer can also be fabricated by forming a $TiN_xB_y$ layer using a CVD process. The diffusion barrier layer is of particular utility in conjunction with tungsten or tungsten silicide conductive layers formed by CVD.

One embodiment of the invention relates a gate electrode of an integrated circuit which comprises a gate oxide layer and a polysilicon layer formed over the gate oxide layer. The gate electrode further comprises a tungsten layer formed over the polysilicon layer. The gate electrode also comprises a diffusion barrier layer formed between the polysilicon layer and the tungsten layer, wherein the diffusion barrier layer comprises $TiN_xB_y$.

Another embodiment of the invention relates to an integrated circuit structure that comprises a dielectric layer and a conductive layer above the dielectric layer. The conductive layer has at least some fluorine atoms therein. The integrated circuit structure further comprises a $TiN_xB_y$ barrier layer between the conductive layer and the dielectric layer, wherein the $TiN_xB_y$ barrier layer inhibits the amount of the fluorine atoms which diffuse into the dielectric layer.

An additional embodiment of the invention relates to a gate in an integrated circuit that comprises a dielectric layer and a $TiN_xB_y$ layer formed over at least a portion of the dielectric layer. The gate further comprises a tungsten layer formed over at least a portion of the $TiN_xB_y$ layer.

One embodiment of the invention relates to an integrated circuit structure that comprises a $TiN_xB_y$ layer and a chemical vapor deposition conductive layer overlying the $TiN_xB_y$ layer. Yet another embodiment of the invention relates to an integrated circuit structure that comprises a $TiN_xB_y$ layer and a tungsten layer overlying the $TiN_xB_y$ layer.

Another aspect of the invention relates to a method of forming a gate electrode comprising the act of forming a gate oxide layer over a semiconductor substrate. The method further comprises the act of forming a $TiN_xB_y$ layer over at least a portion of the gate oxide layer. The method also comprises the act of forming a tungsten layer over at least a portion of the $TiN_xB_y$ layer.

An additional aspect of the invention relates to a method of forming an integrated circuit structure. The method comprises the act of forming a dielectric layer. The method further comprises the act of combining tetrakisdimethyl-aminotitanium (TDMAT) with a boron containing source gas to form a diffusion barrier over at least a portion of the dielectric layer.

Yet another aspect of the invention relates to a method of forming an integrated circuit structure. The method comprises the act of forming a dielectric layer. The method further comprises the act of forming a $TiN_xB_y$ layer over at least a portion of the dielectric layer. The method also comprises the act of forming a conductive layer over at least a portion of the $TiN_xB_y$ layer by combing tungsten hexafluoride and silicon tetrahydride.

A further aspect of the invention relates to a method of forming a gate electrode on a substrate. The method comprises the acts of forming a gate oxide layer over a substrate and forming a TiN layer between the gate oxide layer and the conductive layer. The method further comprises the act of incorporating boron into the TiN layer to form a barrier layer. The method also comprises the act of forming a tungsten layer over at least a portion of the barrier layer.

One embodiment of the invention relates to a method of forming an integrated circuit structure. The method comprises the acts of forming a dielectric layer and forming a barrier layer over the dielectric layer. The method also comprises the act of forming a conductor layer above the dielectric layer wherein the conductor layer releases fluorine atoms. The method further comprises the act of inhibiting at least a portion of the fluorine atoms from diffusing into the dielectric layer.

For purposes of summarizing the invention, certain aspects, advantages and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

BRIEF DESCRIPTION OF THE DRAWINGS

These and other aspects, advantages, and novel features of the invention will become apparent upon reading the following detailed description and upon reference to the accompanying drawings. The present invention is described in more detail below in connection with the attached drawings.

DETAILED DESCRIPTION OF THE PREFERRED EMBODIMENTS

Figure 1:
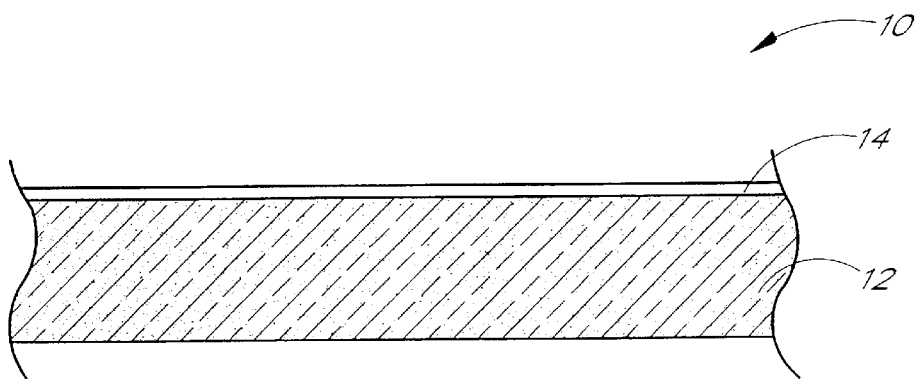
FIG. 1 is a schematic cross-section of a semiconductor device on which a gate electrode will be fabricated, in accordance with one embodiment of the present invention.

FIG. 1 illustrates a semiconductor device 10 on which a gate electrode will be fabricated, in accordance with one embodiment of the present invention. Gate electrodes are structures frequently found in common integrated circuit configurations, such as transistor arrays in memory circuits. The semiconductor device 10 includes a substrate 12. While the illustrated substrate 12 comprises an intrinsically doped monocrystalline silicon wafer, it will be understood by one of skill in the art of semiconductor fabrication that the "substrate" in other arrangements can comprise other forms of semiconductor layers which include active or operable portions of semiconductor devices.

A gate oxide layer 14 is shown covering the substrate 12. The gate oxide layer 14 is a dielectric that can be formed using any suitable process. For example, the gate oxide may be grown through a mask or formed through trench isolation. Other methods of forming the gate oxide layer 14 will become apparent to those of skill in the art in light of the present disclosure. Typically, the gate oxide layer 14 has a thickness of about 30 to 200 angstroms.

Figure 2:
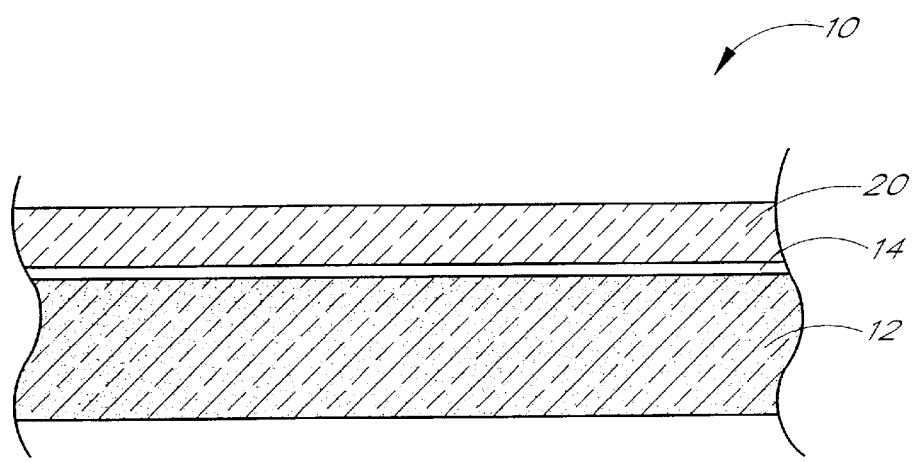
FIG. 2 illustrates the device of FIG. 1 after the formation of a polysilicon layer.

As illustrated in FIG. 2, a polysilicon layer 20 is formed over the gate oxide layer 14. The polysilicon layer 20 can be formed using any suitable process. For example, the polysilicon layer 20 may be formed by conventional chemical vapor deposition (CVD) and can be in situ doped for conductivity. Other methods of forming the polysilicon layer 20 will become apparent to those of skill in the art in light of the present disclosure. The polysilicon layer 20 usually has a thickness of about 300 to 1,500 angstroms.

Figure 3:
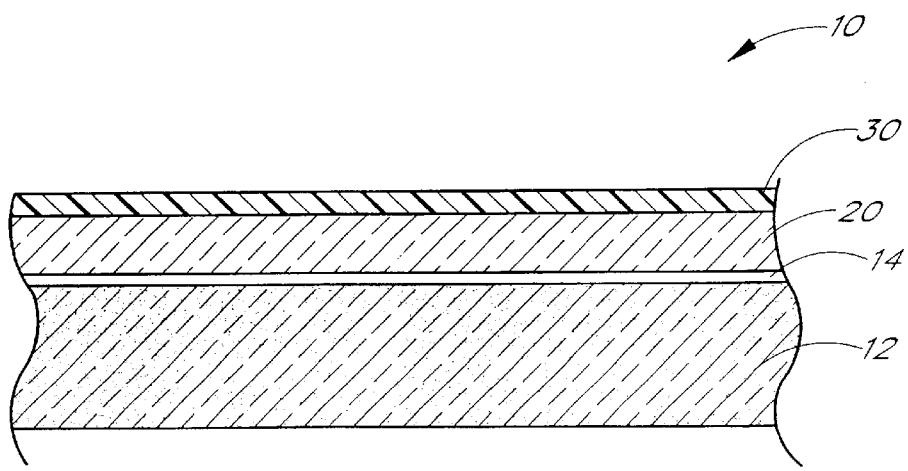
FIG. 3 illustrates the device of FIG. 2 after the formation of a diffusion barrier layer.

As illustrated in FIG. 3, a diffusion barrier layer 30 is then fabricated over the polysilicon layer 20. The diffusion barrier layer 30 comprises $TiN_xB_y$. In forming the diffusion barrier layer 30, any suitable process can be employed wherein the relative boron and nitrogen concentrations are controlled to fall within the desired ranges.

In one embodiment, for example, the diffusion barrier layer 30 is fabricated using a first process, which begins with the formation of a titanium nitride (TiN) layer over the polysilicon layer 20 followed by the incorporation of boron into the TiN layer. Any suitable process can be employed to form the TiN layer.

For example, the TiN layer may be formed by reactively sputtering a titanium target in a nitrogen-containing ambient. Suitable sputtering reactors are commercially available from Applied Materials of Santa Clara, Calif. or Tokyo Electron Ltd. of Japan. The sputtering plasma comprises a substantially inert gas, preferably argon, and nitrogen ions from a nitrogen source gas, preferably nitrogen ($N_2$) or ammonia ($NH_3$).

The concentration of the nitrogen-containing gas in the sputtering chamber determines the nitrogen concentration of the TiN layer. In one embodiment, the concentration of the nitrogen gas in the sputtering chamber is in the range of about 5% to 30%. To achieve a concentration in this range, nitrogen-containing gas can be introduced into the sputtering chamber at a rate of between about 1 and 15 standard cubic centimeters per minute (sccm) while the inert gas is introduced into the sputtering chamber at a rate of between about 30 and 50 sccm. The radio frequency (RF) energy of the preferred sputtering reactor is generally set between about 1 and 2 kilowatts (kW), preferably at 1.5 kW. In light of the present disclosure, however, one of skill in the art can readily determine the appropriate sputtering parameters through routine optimization to achieve the desired TiN composition in a given reactor configuration.

Alternatively, the TiN layer may be formed using a tetrakisdimethyl-aminotitanium (TDMAT) process. Such a process is described in U.S. Pat. No. 5,693,377 which is incorporated herein in its entirety by reference thereto. For example, a metal organic chemical vapor deposition process with a tetrakisdimethyl-amidotitanium (TDMAT) precursor and a carrier gas such as nitrogen (N2) can be used to create the TiN layer. The TDMAT process can be conducted in an Applied Materials TiN CVD chamber at between about 300° C. and 500° C., more preferably between 400° C. and 450° C. The chamber pressure is typically maintained between about 0.1 Torr and 2.0 Torr and preferably at about 0.5 Torr. TiN deposited by this method may also include small amounts of oxygen and carbon due organic content of the precursor.

In addition to the sputtering process and the TDMAT process described above, other methods of forming the TiN layer will become apparent to those of skill in the art in light of the present disclosure. After the TiN layer has been formed, boron is incorporated into the TiN layer by treating the device 10 with a boron-containing gas, such as diborane ($B_2H_6$). The boron-containing gas may optionally include silane ($SiH_4$) at a concentration in the range of about 1 to 50%. The device 10 is treated in a rapid thermal processing (RTP) chamber, such as a CVD chamber or the like. Suitable CVD reactors are commercially available from companies such as Applied Materials Inc. of Santa Clara, Calif. and PlasmaQuest of Dallas, Tex.

The concentration of the boron-containing gas in the CVD chamber determines the concentration of boron in the diffusion barrier layer 30. In one embodiment, the concentration of boron in the diffusion barrier layer 30 ranges from about 0.01 to 10 atomic percent, preferably 0.1–3 atomic percent. To achieve a concentration in this range, the boron-containing gas can be introduced into the CVD chamber at a rate of between about 5 and 500 standard cubic centimeters per minute (sccm).

The pressure in the preferred CVD chamber is maintained between about 0.5 and 100 Torr. The temperature in the preferred CVD chamber is maintained between about 300° C. and 700° C., preferably at 450° C. Adjusting the flow rate, pressure, temperature, or other parameters of the reactants in the CVD chamber may cause, for example, the boron to become incorporated into the TiN layer more quickly, or the resulting $TiN_xB_y$ layer to exhibit a greater concentration of boron. In light of the present disclosure, however, one of skill in the art can readily determine the appropriate CVD parameters through routine optimization to achieve the desired $TiN_xB_y$ composition in a given reactor configuration.

In one embodiment, the diffusion barrier layer 30 is fabricated using the process described above. The $TiN_xB_y$ of the diffusion barrier layer 30 has an x-factor in the range of about 0.2 to 0.499, and more preferably in the range of about 0.25 to 0.48. Furthermore, the $TiN_xB_y$ of the diffusion barrier layer 30 has a y-factor in the range of about 0.01 to 10, and more preferably in the range of about 0.1 to 3. The diffusion barrier layer 30 typically has a thickness of about 50 to 500 angstroms.

In another embodiment, the diffusion barrier layer 30 is fabricated using a second process, in which a $TiN_xB_y$ layer is formed directly over the polysilicon layer 20. The $TiN_xB_y$ layer is formed by incorporating boron into a TDMAT process. To form the $TiN_xB_y$ layer using this method, TDMAT is decomposed in the presence of a boron-containing source gas, such as diborane ($B_2H_6$), in a CVD chamber. The pressure in the preferred CVD chamber is maintained between about 0.5 and 100 Torr. The temperature in the preferred CVD chamber is maintained between about 300° C. and 600° C., preferably at 400° C. or 450° C. In light of the present disclosure, however, one of skill in the art can readily determine the appropriate TDMAT process parameters through routine optimization to achieve the desired $TiN_xB_y$ composition in a given reactor configuration.

In one embodiment, the diffusion barrier layer 30 is fabricated over the polysilicon layer 20 using the TDMAT process including boron described above. The $TiN_xB_y$ of the diffusion barrier layer 30 has an x-factor in the range of about 0.2 to 0.499, and more preferably in the range of about 0.25 to 0.48. Furthermore, the $TiN_xB_y$ of the diffusion barrier layer 30 has a y-factor in the range of about 0.01 to 10, and more preferably in the range of about 0.1 to 3. The diffusion barrier layer 30 typically has a thickness of about 50 to 500 angstroms.

In another embodiment, the diffusion barrier layer 30 is fabricated using a third process, in which a $TiN_xB_y$ layer is formed directly over the polysilicon layer 20 using a CVD process. To fabricate the diffusion barrier layer 30 using this method, the device 10 is placed in a suitable CVD chamber including a titanium-containing source gas, a nitrogen-containing source gas, and a boron-containing source gas. Each of these source gases may comprise a wide variety of suitable materials.

For example, the titanium-containing source gas may comprise titanium tetrachloride ($TiCl_4$) or titanium tetraiodide ($TiI_4$); the nitrogen containing source gas may comprise ammonia ($NH_3$) or a plasma of nitrogen ions in a substantially inert gas, such as hydrogen or argon; and the boron-containing source gas may comprise diborane ($B_2H_6$). Other suitable source gases will become apparent to those of skill in the art in light of the present disclosure.

The pressure in the preferred CVD chamber is maintained between about 0.5 and 100 Torr. The temperature in the preferred CVD chamber is maintained between about 500° C. and 700° C., preferably at 600° C. In light of the present disclosure, however, one of skill in the art can readily determine the appropriate CVD parameters through routine optimization to achieve the desired $TiN_xB_y$ composition in a given reactor configuration.

In one embodiment, the diffusion barrier layer 30 is fabricated over the polysilicon layer 20 using the CVD process described above. The $TiN_xB_y$ of the diffusion barrier layer 30 has an x-factor in the range of about 0.2 to 0.499, and more preferably in the range of about 0.25 to 0.48. Furthermore, the $TiN_xB_y$ of the diffusion barrier layer 30 has a y-factor in the range of about 0.01 to 10, and more preferably in the range of about 0.1 to 3. The diffusion barrier layer 30 typically has a thickness of about 50 to 500 angstroms.

Figure 4:
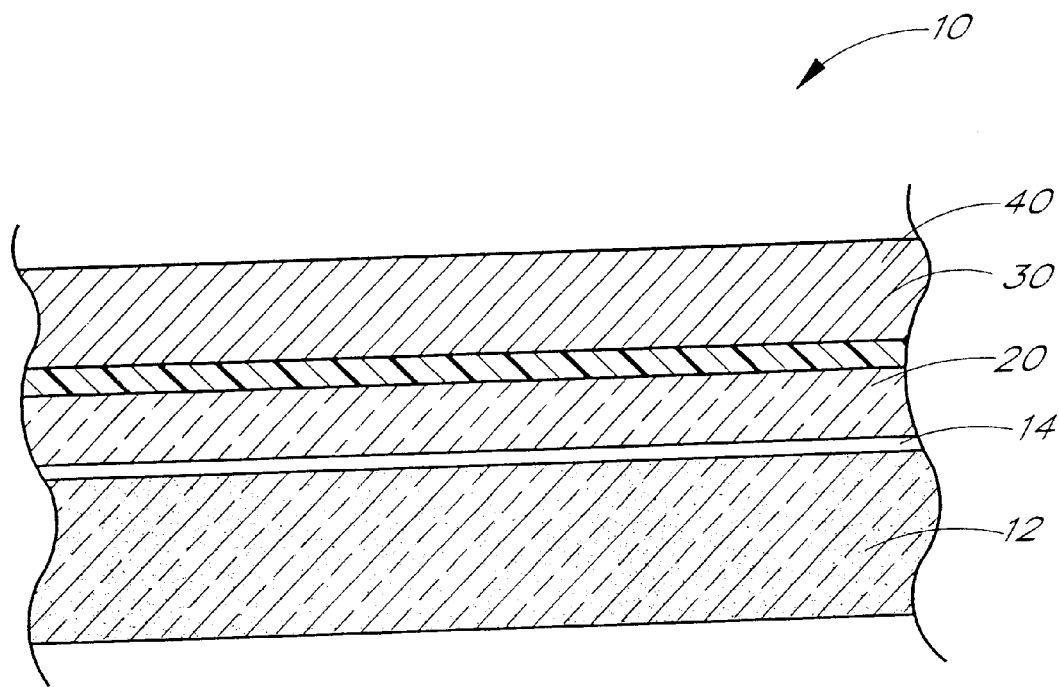
FIG. 4 illustrates the device of FIG. 3 after the formation of a conductive layer.

As illustrated in FIG. 4, a conductive layer 40 is formed over the diffusion barrier layer 30. The conductive layer 40 may comprise any of a number of highly conductive materials containing metals, and particularly materials that can be deposited by CVD. In one embodiment, for example, the conductive layer 40 comprises tungsten (W). In another embodiment, the conductive layer 40 comprises tungsten silicide ($WSi_x$). Other suitable materials for the conductive layer 40 will become apparent to those of skill in the art in light of the present disclosure.

In the illustrated embodiment, the conductive layer 40 comprises tungsten silicide ($WSi_x$), which is formed by CVD with tungsten hexafluoride ($WF_6$) and silicon tetrahydride ($SiH_4$) as set forth in the following formula:

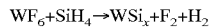

$$WF_6 + SiH_4 \rightarrow WSi_x + F_2 + H_2$$

Alternatively, other silicon source gases (such as disilane, trisilane, di-chlorosilane, etc.) can be used in place of silane, and similarly other metal sources (such as titanium tetrachloride, etc.) can be used in the deposition process. The conductive layer 40 typically has a thickness of about 200 to 4,000 angstroms.

Fluorine atoms are typically incorporated into the conductive layer 40 during the CVD process described above. Similarly, many CVD processes result in hydrogen residue within the deposited conductive layer 40. Post-deposition high-temperature steps tend to cause diffusion of such contaminants through the underlying polysilicon layer 20 in conventional gate electrodes. Fluorine, for example, easily diffuses down through the grain boundaries of the polysilicon layer 20.

After the formation of the conductive layer 40, the device 10 undergoes an anneal step. This anneal is performed to convert the deposited silicide to a lower resistance phase through grain growth and re-orientation during the anneal. The anneal typically takes place at between about 600° C. and 900° C. for about 25 minutes. During this anneal, contaminants such as fluorine typically tend to diffuse from the conductive layer 40 to the gate oxide layer 14.

The diffusion barrier layer 30 comprising $TiN_xB_y$ tends to inhibit contaminant diffusion from the conductive layer 40 to the gate oxide layer 14, such that at least a portion of the contaminants are not allowed to reach and degrade the gate oxide layer 14. To reduce contaminant diffusion, the diffusion barrier layer 30 is formed between the conductive layer 40 and the gate oxide layer 14. In the embodiment illustrated in FIGS. 2–5, for example, the diffusion barrier layer 30 is formed between the polysilicon layer 20 and the conductive layer 40.

Figure 6:
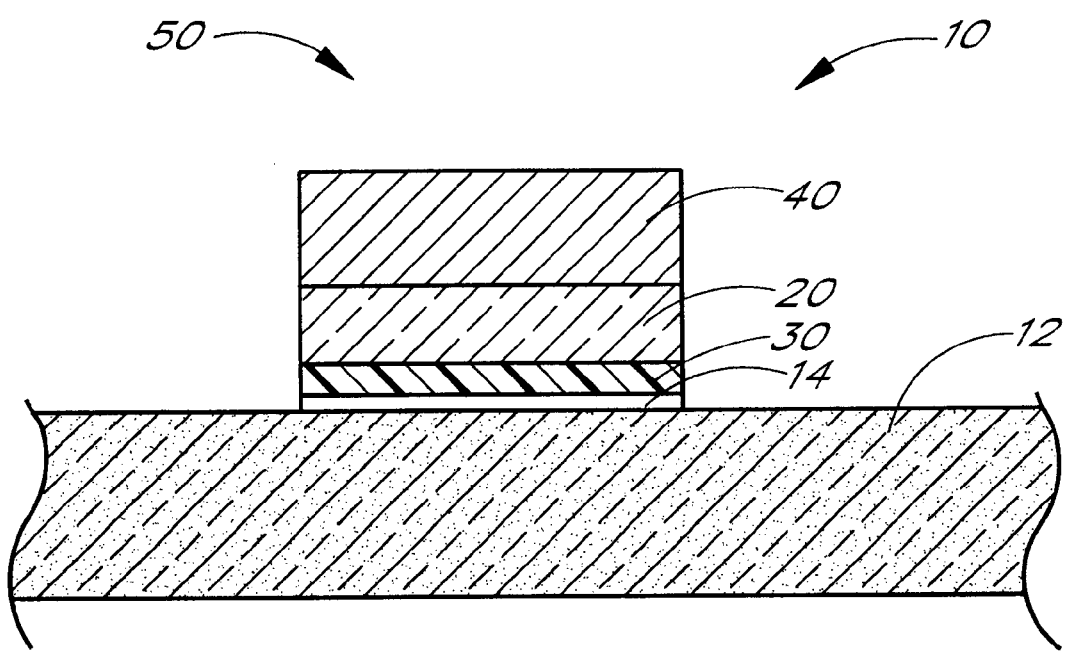
FIG. 6 illustrates another embodiment of a gate electrode.

In other embodiments, the diffusion barrier layer 30 may be formed between the gate oxide layer 14 and the polysilicon layer 20, as illustrated in FIG. 6. Furthermore, other configurations will become apparent to those of skill in the art in light of the present disclosure.

Figure 5:
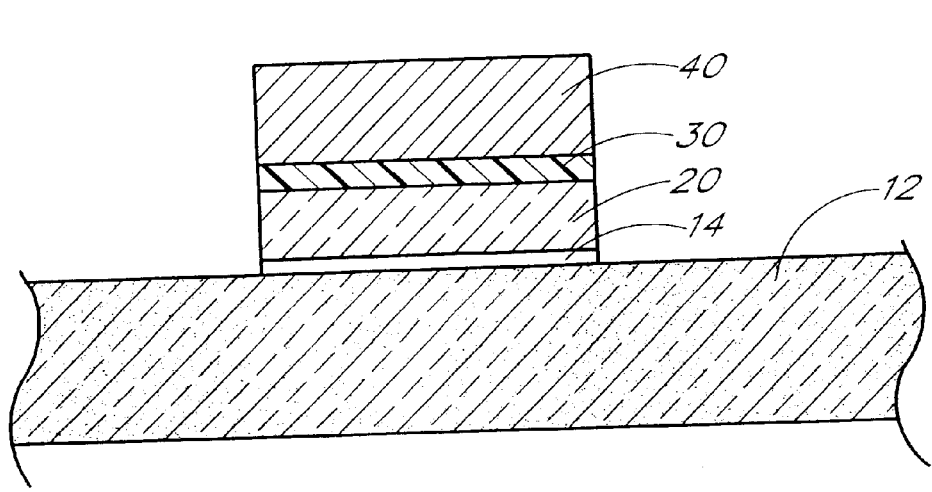
FIG. 5 illustrates the device of FIG. 4 after the layer shave been etched to form a gate electrode.

As illustrated in FIG. 5, after the gate oxide layer 14, polysilicon layer 20, diffusion barrier layer 30, and conductive layer 40 have been formed, the layers are patterned using conventional photolithography and etching techniques to form a gate electrode 50. The layers are masked with photoresist, and etched through to expose the gate oxide layer 14 over transistor source and drain regions. These regions are formed by later doping the substrate 12 to either side of the gate electrode 50.

The $TiN_xB_y$ of the diffusion barrier layer 30 demonstrates certain advantages over conventional diffusion barrier materials. One advantage is that $TiN_xB_y$ is relatively hard. For example, $TiN_{0.4}B$ exhibits a nano-hardness of more than 50 Gpa, which is comparable to the hardness of tungsten carbide (WC).

Another advantage of $TiN_xB_y$ is that it is thermally stable at high temperatures. For example, some embodiments of $TiN_xB_y$ exhibit thermal stability up to approximately 1,500° C. The thermal stability of $TiN_xB_y$ allows it to be used in devices that are manufactured at high temperatures or are subject to high temperatures.

Yet another advantage of $TiN_xB_y$ is that it adheres well to metal layers and semiconductor substrates. The good adhesion properties of $TiN_xB_y$ allow it to be applied without using expensive adhesives, thereby reducing the complexity and expense of applying the diffusion barrier layer 30.

These advantages, either individually or in combination, impede the diffusion of more fluorine atoms than conventional diffusion barrier materials. Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A method of forming a gate electrode comprising:

forming a gate oxide layer over a semiconductor substrate;

forming a $TiN_xB_y$ layer over at least a portion of the gate oxide layer, wherein the x-factor is in a range of about 0.25 to 0.48 and the y-factor is in the range of about 0.1 to 3, wherein the $TiN_xB_y$ layer inhibits fluorine diffusion from the conductive layer to the gate oxide layer;

forming a polysilicon layer over at least a portion of the $TiN_xB_y$ layer; and forming a conductive layer over at least a portion of the polysilicon layer.

2. The method of claim 1, wherein the act of forming a $TiN_xB_y$ layer comprises:

forming a TiN layer; and incorporating boron into the TiN layer.

3. The method of claim 2, wherein the TiN layer is formed by reactively sputtering a titanium target in a nitrogen-containing ambient.

4. The method of claim 2, wherein the TiN layer is formed using a TDMAT process.

5. The method of claim 2, wherein the act of incorporating boron into the TiN layer comprises introducing a boron-containing gas into a chemical vapor deposition chamber.

6. The method of claim 5, wherein the boron-containing gas comprises diborane.

7. The method of claim 1, wherein the $TiN_xB_y$ layer is formed using a chemical vapor deposition process.

8. The method of claim 7, wherein the chemical vapor deposition process includes a titanium-containing source gas, a nitrogen-containing source gas, and a boron-containing source gas.

9. The method of claim 8, wherein the titanium-containing source gas comprises titanium tetrachloride.

10. The method of claim 8, wherein the titanium-containing source gas comprises titanium tetraiodide.

11. The method of claim 8, wherein the nitrogen-containing source gas comprises ammonia.

12. The method of claim 1, wherein the act of forming a $TiN_xB_y$ layer comprises combining tetrakisdimethylaminotitanium with a boron-containing source gas.

13. The method of claim 12 wherein the act of combining occurs at about 0.5 to 100 Torr.

14. The method of claim 12 wherein the act of combining occurs at about 300° C. to 600° C.

15. The method of claim 1 wherein the act of forming the conductive layer forms tungsten.

16. The method of claim 1 wherein the act of forming the conductive layer forms tungsten silicide.

17. The method of claim 1 wherein the act of forming a conductive layer comprises combining tungsten hexafluoride and silicon tetrahydride.

18. The method of claim 17 wherein the act of combining comprises a chemical vapor deposition process.

* * * * *